United States Patent
Wu et al.

(10) Patent No.: US 11,063,180 B2
(45) Date of Patent: Jul. 13, 2021

(54) SUPPORT STRUCTURE WITH SACRIFICE STRUCTURE FOR LIGHT-EMITTING DIODE AND MANUFACTURING METHOD THEREOF

(71) Applicant: PRILIT OPTRONICS, INC., Tainan (TW)

(72) Inventors: Biing-Seng Wu, Tainan (TW); Chao-Wen Wu, Tainan (TW); Chun-Jen Weng, Tainan (TW)

(73) Assignee: PRILIT OPTRONICS, INC., Tainan (TW)

(*) Notice: Subject to any disclaimer, the term of this patent is extended or adjusted under 35 U.S.C. 154(b) by 0 days.

(21) Appl. No.: 16/441,689

(22) Filed: Jun. 14, 2019

(65) Prior Publication Data
US 2019/0386176 A1 Dec. 19, 2019

Related U.S. Application Data

(60) Provisional application No. 62/684,759, filed on Jun. 14, 2018.

(51) Int. Cl.
*H01L 27/15* (2006.01)
*H01L 33/18* (2010.01)
*H01L 33/24* (2010.01)

(52) U.S. Cl.
CPC ............. *H01L 33/18* (2013.01); *H01L 33/24* (2013.01)

(58) Field of Classification Search
None
See application file for complete search history.

(56) References Cited

U.S. PATENT DOCUMENTS 6,142,358 A * 11/2000 Cohn .................. B23K 1/0016
228/44.7
9,153,548 B2 10/2015 Chan et al.

* cited by examiner

*Primary Examiner* — Hung K Vu
(74) *Attorney, Agent, or Firm* — Muncy, Geissler, Olds and Lowe, P.C.

(57) ABSTRACT

A support structure for a light-emitting diode utilizes the configuration of a sacrifice structure to achieve safe separation of a light-emitting diode from a carrier substrate. Specifically, when an external force is applied on the light-emitting diode or the carrier substrate, a breaking layer of the sacrifice structure is the first layer to be broken, so that the light-emitting diode and carrier substrate will become separated from each other.

7 Claims, 7 Drawing Sheets

SUPPORT STRUCTURE WITH SACRIFICE STRUCTURE FOR LIGHT-EMITTING DIODE AND MANUFACTURING METHOD THEREOF

CROSS-REFERENCE TO RELATED APPLICATION

This application claims priority to and the benefit of, pursuant to 35 U.S.C. § 119, U.S. provisional patent application Ser. No. 62/684,759 filed on Jun. 14, 2018, the disclosure of which is incorporated herein in its entirety by reference.

BACKGROUND OF THE INVENTION

1. Field of the Invention

The present invention relates to a support structure for light-emitting diode and a manufacturing method the support structure for light-emitting diode. More particularly, the present invention is applicable to micro light-emitting diodes, and uses a sacrifice structure to serve as a sacrificial layer for enabling the micro light-emitting diodes to safely separate from a carrier substrate, as well as a manufacturing method of the support structure for the light-emitting diode.

2. Description of the Related Art

In the modem era, user requirements for image quality have continued to increase, and display technology has met these requirements with rapid developments. Two classifications of mainstream displays include light-emitting diode (LED) displays and organic light-emitting diode displays (OLED). Though an organic light-emitting diode display has high pixel resolution, organic light-emitting diodes do not have long lifespans. A light-emitting diode display generally has lower pixel resolution than the organic light-emitting diode display, but the lifespan of light-emitting diodes is longer than that of organic light-emitting diodes. For this reason, some manufacturers have planned to reduce the size of the light-emitting diodes to form micro light-emitting diodes (micro-LED) for display applications. However, because the micro-light-emitting diode is within the micrometer-scale size, a sacrifice structure is inevitably required to assist in performing mass transfer, so as to smoothly transfer a great amount of the micro-light-emitting diodes to a circuit board of display. Currently, it is still difficult to improve the yield rate of displays constituted of micro-light-emitting diodes.

US issued U.S. Pat. No. 9,153,548B2 discloses a technique using stabilization posts to transfer micro-light-emitting diodes to a carrier substrate and the micro-light-emitting diodes on the carrier substrate are transferred to a circuit board of a display. However, the stabilization posts are in direct contact with metal contacts of the micro-light-emitting diodes and the metal contacts of the light-emitting diodes may possibly be damaged during the transfer process, causing the micro-light-emitting diodes not being able to be lit and reducing the yield rate of the micro-light-emitting diodes.

Therefore, what is needed is to develop a support structure for light-emitting diode and a manufacturing method thereof to solve the conventional problem.

SUMMARY OF THE INVENTION

An objective of the present invention is to provide a support structure for light-emitting diode and a manufacturing method of the support structure for light-emitting diode, so as to solve the conventional problems.

In order to achieve the objective, the present invention provides a support structure for light-emitting diode, and the supporting structure includes a carrier substrate, an adhesive layer, and a sacrifice structure. The adhesive layer is disposed on the carrier substrate. The sacrifice structure is disposed on the adhesive layer, and includes a supporting post and a breaking layer. The breaking layer is disposed on the supporting post. The structural strength of the sacrifice structure is sufficient to support a light-emitting diode, and when an external force is applied to the light-emitting diode or the carrier substrate, the breaking layer is the first layer to be broken, separating the light-emitting diode and the carrier substrate from each other. The support structure for light-emitting diode of the present invention utilizes the breaking layer to separate the light-emitting diode from the carrier substrate. The separated light-emitting diode is then transferred to a circuit board of the display.

Preferably, the sacrifice structure is disposed between the electrodes of the light-emitting diode and the adhesive layer.

Preferably, the sacrifice structure is disposed between the dielectric layer of the light-emitting diode and the adhesive layer.

Preferably, the sacrifice structure is disposed between a perimeter of the light-emitting diode and the adhesive layer.

Preferably, a cross-sectional area of the breaking layer is lower than or equal to a cross-sectional area of the supporting post.

Preferably, a supporting force of the breaking layer is lower than a supporting force of the supporting post.

Preferably, an interface bonding force of the breaking layer is lower than an interface bonding force of the supporting post.

In order to achieve the objective, the present invention provides a manufacturing method of a support structure for a light-emitting diode, and the method includes steps of (1) depositing a breaking layer and a supporting layer, in a sequential order, on a light-emitting diode. (2) partly etching the breaking layer and the supporting layer, and transforming the supporting layer into a supporting post, wherein the breaking layer and the supporting post forming a sacrifice structure (4) depositing an adhesive layer on the supporting post, to adhere a carrier substrate on the adhesive layer, so as to form a stacked element. (5) removing an original substrate of and the light-emitting diode, and taking over the stacked element to make the sacrifice structure support the light-emitting diode. Wherein structural strength of the sacrifice structure is sufficient to support the light-emitting diode, and when an external force is applied to the light-emitting diode or the carrier substrate, the breaking layer is the first layer to be broken, separating the light-emitting diode and the carrier substrate from each other. By means of the foregoing manufacturing method, the light-emitting diode is successfully transferred to the carrier substrate.

Preferably, before depositing the adhesive layer on the supporting post, further comprising depositing a coating layer to covering the sacrifice structure, partly etching the coating layer to expose the supporting post.

Preferably, the sacrifice structure is disposed between the electrodes of the light-emitting diode and the adhesive layer.

Preferably, the sacrifice structure is disposed between the dielectric region of the light-emitting diode and the adhesive layer.

Preferably, the sacrifice structure is disposed between a perimeter of the light-emitting diode and the adhesive layer.

Preferably, a cross-sectional area of the breaking layer is lower than or equal to a cross-sectional area of the supporting post.

Preferably, a supporting force of the breaking layer is lower than a supporting force of the supporting post.

Preferably, an interface bonding force of the breaking layer is lower than an interface bonding force of the supporting post.

According to above-mentioned contents, the support structure for a light-emitting diode of the present invention uses a configuration of the breaking layer, so that the light-emitting diodes can be separated from the carrier substrate without damaging the electrodes of the light-emitting diodes, and the separated light-emitting diodes can be smoothly transferred to the circuit board of the display.

According to above-mentioned contents, the manufacturing method of the support structure for light-emitting diode can successfully transfer the light-emitting diodes from the original substrate to the carrier substrate without damaging the film in the light-emitting diodes.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that although the terms "first", "second", "third", and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 1:
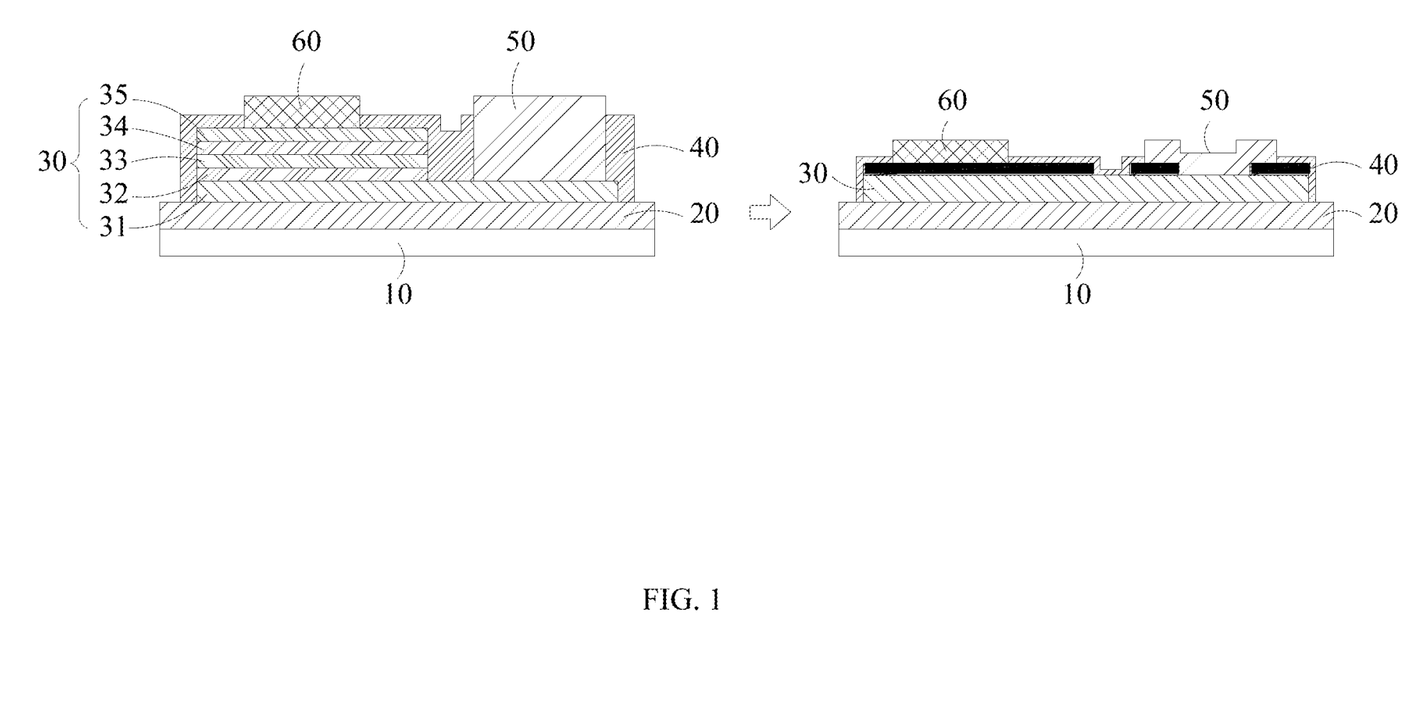
FIG. 1 is a structural diagram of a light-emitting diode according to the embodiment of the present invention.

Please refer to FIG. 1, which is a structural diagram of a light-emitting diode according to the embodiment of the present invention. As shown in FIG. 1, the light-emitting diode comprises an original substrate 10, a buffer layer 20, a light-emitting structure 30, a dielectric region 40, a first type contact region 50 and a second type contact region 60. The buffer layer 20 is disposed on the original substrate 10. The light-emitting structure 30 is disposed on the buffer layer 20 and comprises a first type heavily-doped layer 31, a first type doped layer 32, an active layer 33, a second type doped layer 34 and a second type heavily-doped layer 35. The first type doped layer 32 is disposed on the first type heavily-doped layer 31, the active layer 33 is disposed on the first type doped layer 32, the second type doped layer 34 is disposed on the active layer 33, and the second type heavily-doped layer 35 is disposed on the second type doped layer 34. The first type heavily-doped layer 31, the first type doped layer 32, the second type doped layer 34 and the second type heavily-doped layer 35 can provide electrons and holes to the active layer 33 which has a multiple-quantum-well structure, and electrons and holes recombine in the active layer 33 to emit light. The first type contact region 50 is disposed on the first type heavily-doped layer 31, and the second type contact region 60 is disposed on the second type heavily-doped layer 35. The first type contact region 50 and the second type contact region 60 are the electrodes of the light-emitting diode. The dielectric region 40 surrounds the first type contact region 50 and a second type contact region 60 to confine the spreading direction of the current applied to the light-emitting diode. And the dielectric region 40 is made of the dielectric material, such as $SiO_x$ and $SiN_x$. In an embodiment, the first type may be N type, and the second type may be P type. In the another, the first type may be P type, and the second type may be N type.

The flow of manufacturing the light-emitting diode with the support structure for the present invention is described in following paragraphs. First, the buffer layer 20, the first type heavily-doped layer 31, the first type doped layer 32, the active layer 33, the second type doped layer 34 and the second type heavily-doped layer 35 are deposited on the substrate 10 in a sequential order. Secondly, etching and exposure processes are performed on the light-emitting structure 30 so as to expose the first type heavily-doped layer 31. Hence, the part of the light-emitting structure 30 exposes the first type heavily-doped layer 31, and the part of the light-emitting structure 30 does not expose the first type heavily-doped layer 31. Thirdly, the first type contact region 50 is deposited on the first type heavily-doped layer 31, and the second type contact region 60 is deposited on the second type heavily-doped layer 35. Fourthly, the dielectric region 40 is deposited and surrounds the first type contact region 50 and the second type contact region 60, so as to form the light-emitting diode as shown in FIG. 1.

In an embodiment, the substrate 10 can be one of silicon substrate, GaAs substrate, the glass substrate, quartz substrate, gap substrate, GaAsP substrate, AlGaAs substrate, ZnO substrate, sapphire substrate, InP substrate, and SiC substrate. The materials of the buffer layer 20, the first type heavily-doped layer 31, the first type doped layer 32, the emission layer 33, the second type doped layer 34, the second type heavily-doped layer 35 can be selected from a group consisting of GaAs, InGaAs, InGaAsP, AlAs, AlGaInAs, AlGaInP, AlGaAs, InGaNAs, GaAsSb, GaSb, InP, InAs, GaP, AlP, GaN, AlGaN, InGaN, and AlInGaN. In an embodiment, the material of the buffer layer 20, the first type heavily-doped layer 31, the first type doped layer 32, the active layer 33, the material of the second type doped layer 34 and the second type heavily-doped layer 35 are able to match that of the substrate 10, to improve the lattice matching rate, thereby reducing occurrence of lattice mismatch. The material of the second type contact region 60 and the first type contact region 50 can be at least one of indium (In), tin (Sn), aluminum (Al), gold (Au), platinum (Pt), zinc (Zn), germanium (Ge), silver (Ag), lead (Pb), palladium (Pd), copper (Cu), AuBe, BeGe, nickel (Ni), PbSn, chromium (Cr), AuZn, titanium (Ti), tungsten (W), TiW, or a combination thereof.

Figure 2:
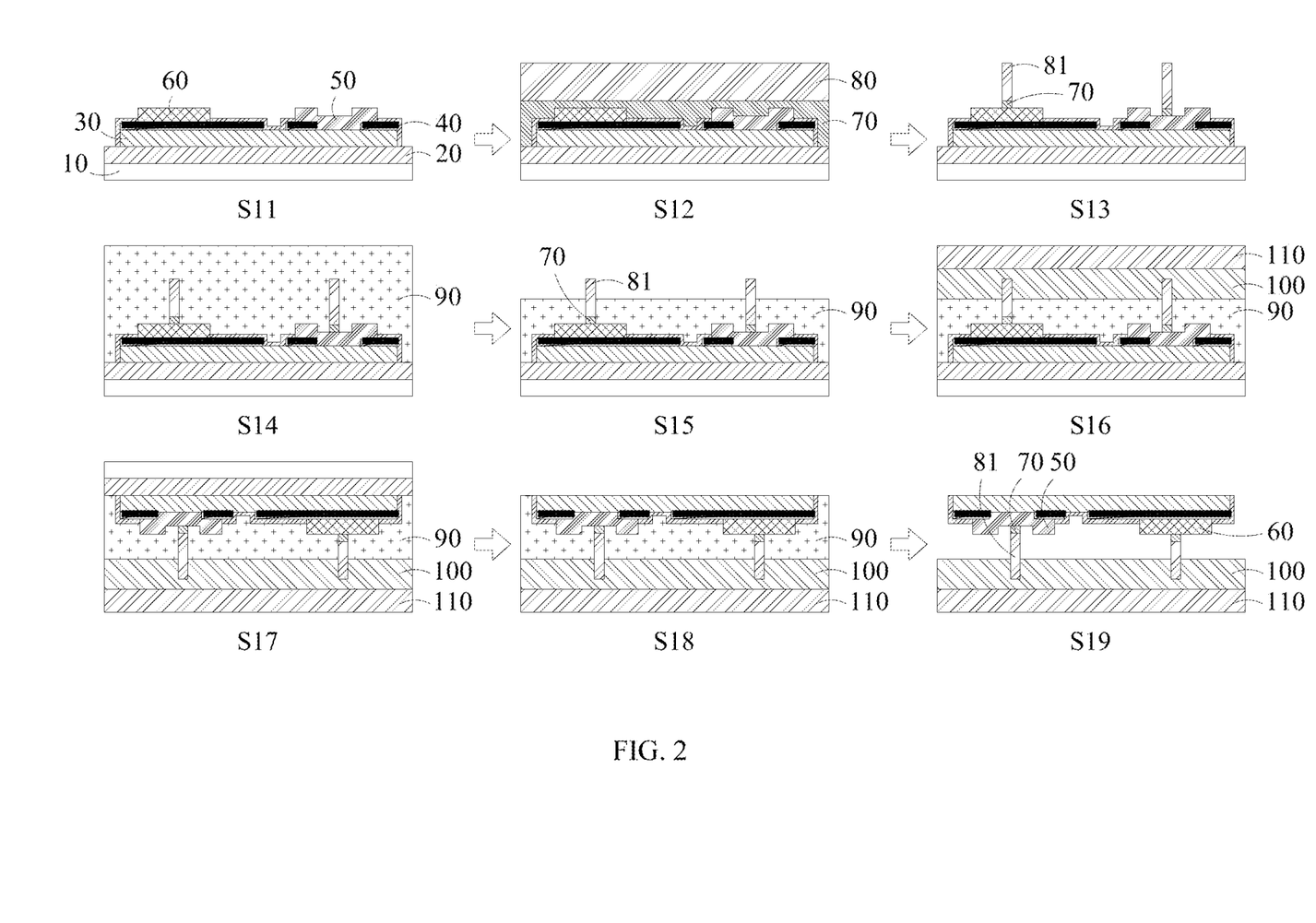
FIG. 2 is a manufacturing method of the support structure for light-emitting diode according to the first embodiment of the present invention.

Please refer to FIG. 2, which is a manufacturing method of the support structure for light-emitting diode according to the first embodiment of the present invention. The details of the manufacturing method of the support structure for light-emitting diode according to the first embodiment of the present invention are described below. The method including steps S11 to S17 is as below: (1) In step S11, the light-emitting diode shown in FIG. 1 is provided and the size of the light-emitting diode is micrometer. (2) In step S12, the breaking layer 70 and the supporting layer 80 are deposited in a sequential order and the supporting layer 80 is constituted of the organic insulation material and the inorganic insulation material. The inorganic insulation material comprises $SiO_x$ or $SiN_x$. (3) In step S13, the etching and exposure processes are performed. The breaking layer 70 is partly etched, and the supporting layer 80 is transformed into the supporting post 81. The etched breaking layer 70 and the supporting post 81 form a sacrifice structure. Two sacrifice structures are located on the first type contact region 50 and the second type contact region 60. It needs to be mentioned that the number of the sacrifice structures may be adjusted according to the actual need of the light-emitting diode, but is not limited thereto. (4) In step S14, the coating layer 90 is deposited and covers etched breaking layer 70 and the supporting posts 81. The coating layer 90 is constituted of photoresist. (5) In Step S15, the coating layer 90 is partly etched to expose the supporting posts 81. (6) In step S16, the adhesive layer 100 is deposited on the supporting layer 90, and the material of the adhesive layer 100 can one of titanium (Ti), aluminum (Al), chromium (Cr), nickel (Ni), alloy thereof, adhesive material and photo resist; the carrier substrate 110 is able to be adhered on the adhesive layer 100 to form a stacked element; preferably, the carrier substrate 110 can be one of metal substrate, Si wafer, sapphire or glass substrate, and the metal substrate can be one of copper (Cu), aluminum (Al), molybdenum (Mo), nickel (Ni), tungsten (W), or alloy thereof. (7) In step S17, the stacking element is flipped to interchange the sequential order of the carrier substrate 110 and the original substrate 10. Namely, the original substrate is above the carrier substrate 110. (8) In step S18, the laser lift-off method or sacrificial layer lift-off method is performed to remove the original substrate 10 and the buffer layer 20. (9) In step S19, the exposure process and chemical developer are used to remove the coating layer 80, so that the light-emitting diode is supported by the sacrifice structures. The structural strength of the sacrifice structure is sufficient to support the light-emitting diode, and when an external force is applied to the light-emitting diode or the carrier substrate 110, the breaking layer 70 is the first layer to be broken, and the light-emitting diode and the carrier substrate 110 are separated from each other. Through operations of aforementioned method, the light-emitting diodes is able to be successfully transferred from the original substrate 10 to the carrier substrate 110, and the sacrifice structures can be manufactured to support the light-emitting diode.

Figure 3:
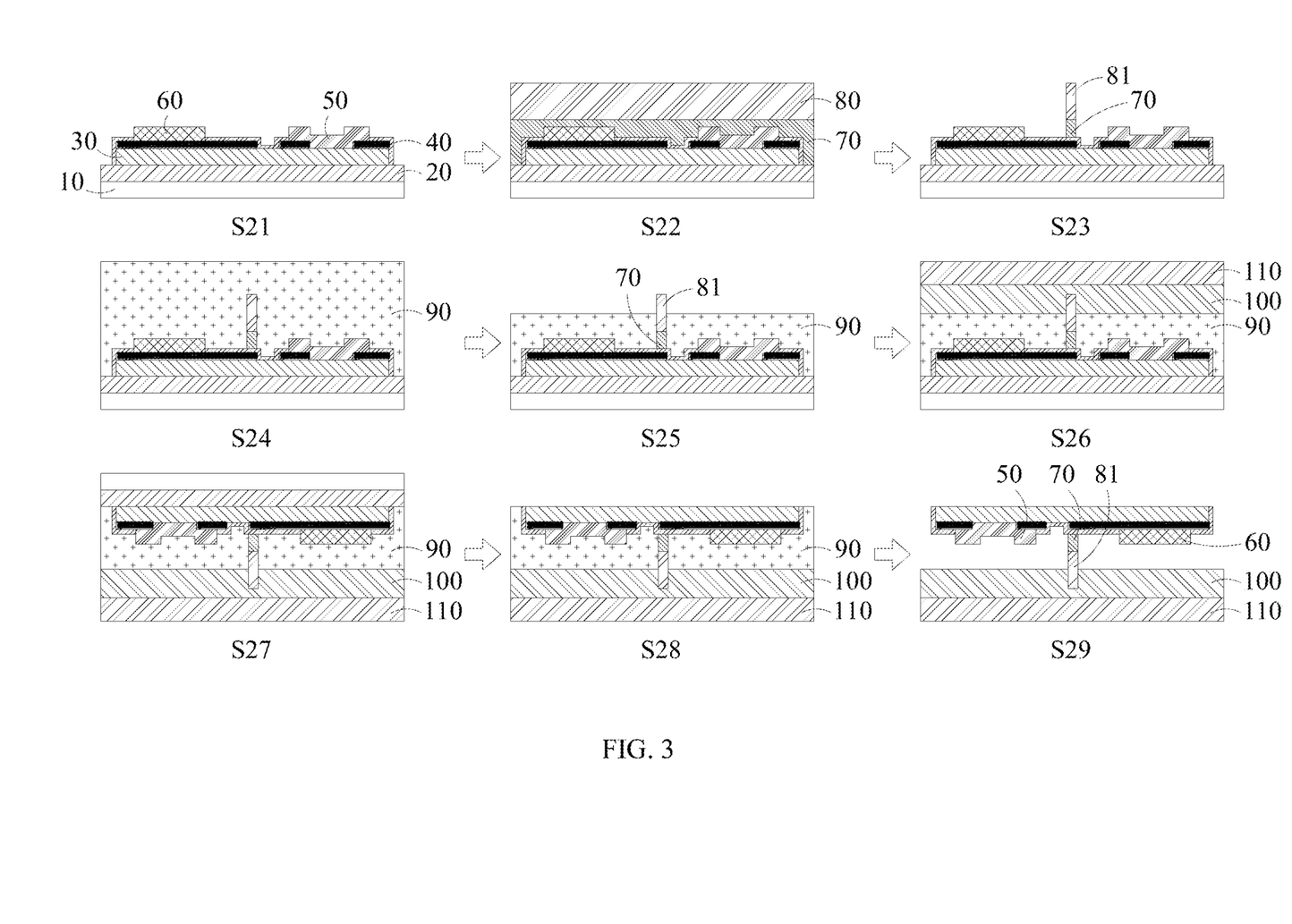
FIG. 3 is a manufacturing method of the support structure for light-emitting diode according to the second embodiment of the present invention.

Please refer to FIG. 3, which is a manufacturing method of the support structure for light-emitting diode according to the second embodiment of the present invention. The details of the manufacturing method of the support structure for light-emitting diode according to the first embodiment of the present invention are described below. The method including steps S11 to S17 is as below: (1) In step S21, the light-emitting diode shown in FIG. 1 is provided and the size of the light-emitting diode is micrometer. (2) In step S22, the breaking layer 70 and the supporting layer 80 are deposited in a sequential order and the supporting layer 80 is constituted of the organic insulation material and the inorganic insulation material. The inorganic insulation material comprises $SiO_x$ or $SiN_x$. (3) In step S23, the etching and exposure processes are performed. The breaking layer 70 is partly etched, and the supporting layer 80 is transformed into the supporting post 81. The etched breaking layer 70 and the supporting post 81 form a sacrifice structure. The sacrifice stricture is located on the dielectric region 40. It needs to be mentioned that the number of the sacrifice structures may be adjusted according to the actual need of the light-emitting diode, but is not limited thereto. (4) In step S24, the coating layer 90 is deposited and covers etched breaking layer 70 and the supporting post 81. The coating layer 90 is constituted of photoresist. (5) In Step S25, the coating layer is partly etched to expose the supporting post 81. (6) In step S26, the adhesive layer 100 is deposited on the supporting layer 90, and the material of the adhesive layer 100 can one of titanium (Ti), aluminum (Al), chromium (Cr), nickel (Ni), alloy thereof, adhesive material and photo resist; the carrier substrate 110 is able to be adhered on the adhesive layer 100 to form a stacked element; preferably, the carrier substrate 110 can be one of metal substrate, Si wafer, sapphire or glass substrate, and the metal substrate can be one of copper (Cu), aluminum (Al), molybdenum (Mo), nickel (Ni), tungsten (W), or alloy thereof. (7) In step S27, the stacking element is flipped to interchange the sequential order of the carrier substrate 110 and the original substrate 10. Namely, the original substrate is above the carrier substrate 110. (8) In step S28, the laser lift-off method or sacrificial layer lift-off method is performed to remove the original substrate 10 and the buffer layer 20. (9) In step S29, the exposure process and chemical developer are used to remove the coating layer 80, so that the light-emitting diode is supported by the sacrifice structures. The structural strength of the sacrifice structure is sufficient to support the light-emitting diode, and when an external force is applied to the light-emitting diode or the carrier substrate 110, the breaking layer 70 is the first layer to be broken, and the light-emitting diode and the carrier substrate 110 are separated from each other. Through operations of aforementioned method, the light-emitting diodes is able to be successfully transferred from the original substrate 10 to the carrier substrate 110, and the sacrifice structures can be manufactured to support the light-emitting diode.

Figure 4:
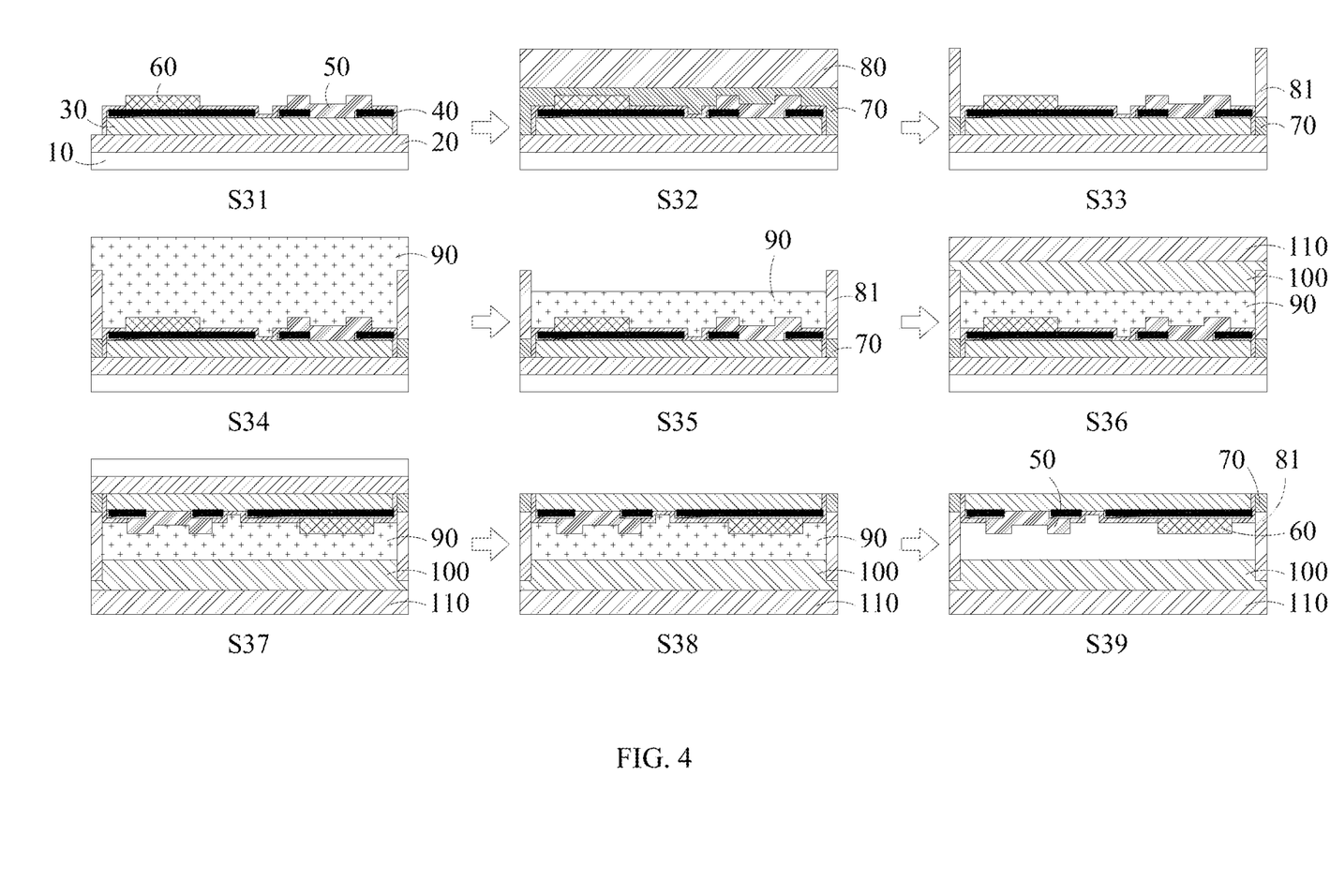
FIG. 4 is a manufacturing method of the support structure for light-emitting diode according to the third embodiment of the present invention.

Please refer to FIG. 4, which is a manufacturing method of the support structure for light-emitting diode according to the third embodiment of the present invention. The details of the manufacturing method of the support structure for light-emitting diode according to the first embodiment of the present invention are described below. The method including steps S11 to S17 is as below: (1) In step S31, the light-emitting diode shown in FIG. 1 is provided and the size of the light-emitting diode is micrometer. (2) In step S32, the breaking layer 70 and the supporting layer 80 are deposited in a sequential order and the supporting layer 80 is constituted of the organic insulation material and the inorganic insulation material. The inorganic insulation material comprises $SiO_x$ or $SiN_x$. (3) In step S33, the etching and exposure processes are performed. The breaking layer 70 is partly etched, and the supporting layer 80 is transformed into the supporting posts 81. The etched breaking layer 70 and the supporting posts 81 form a sacrifice structure. The sacrifice structure is located on the perimeter of the light-emitting diode. It needs to be mentioned that the number of the sacrifice structures may be adjusted according to the actual need of the light-emitting diode, but is not limited thereto. (4) In step S34, the coating layer 90 is deposited and covers etched breaking layer 70 and the supporting posts 81. The coating layer 90 is constituted of photoresist. (5) In Step S35, the coating layer is partly etched to expose the supporting posts 81. (6) In step S36, the adhesive layer 100 is deposited on the supporting layer 90, and the material of the adhesive layer 100 can one of titanium (Ti), aluminum (Al), chromium (Cr), nickel (Ni), alloy thereof, adhesive material and photo resist; the carrier substrate 110 is able to be adhered on the adhesive layer 100 to form a stacked element; preferably, the carrier substrate 110 can be one of metal substrate, Si wafer, sapphire or glass substrate, and the metal substrate can be one of copper (Cu), aluminum (Al), molybdenum (Mo), nickel (Ni), tungsten (W), or alloy thereof. (7) In step S37, the stacking element is flipped to interchange the sequential order of the carrier substrate 110 and the original substrate 10. Namely, the original substrate is above the carrier substrate 110. (8) In step S38, the laser lift-off method or sacrificial layer lift-off method is performed to remove the original substrate 10 and the buffer layer 20. (9) In step S39, the exposure process and chemical developer are used to remove the coating layer 80, so that the light-emitting diode is supported by the sacrifice structures. The structural strength of the sacrifice structure is sufficient to support the light-emitting diode, and when an external force is applied to the light-emitting diode or the carrier substrate 110, the breaking layer 70 is the first layer to be broken, and the light-emitting diode and the carrier substrate 110 are separated from each other. Through operations of aforementioned method, the light-emitting diodes is able to be successfully transferred from the original substrate 10 to the carrier substrate 110, and the sacrifice structures can be manufactured to support the light-emitting diode.

Figure 5:
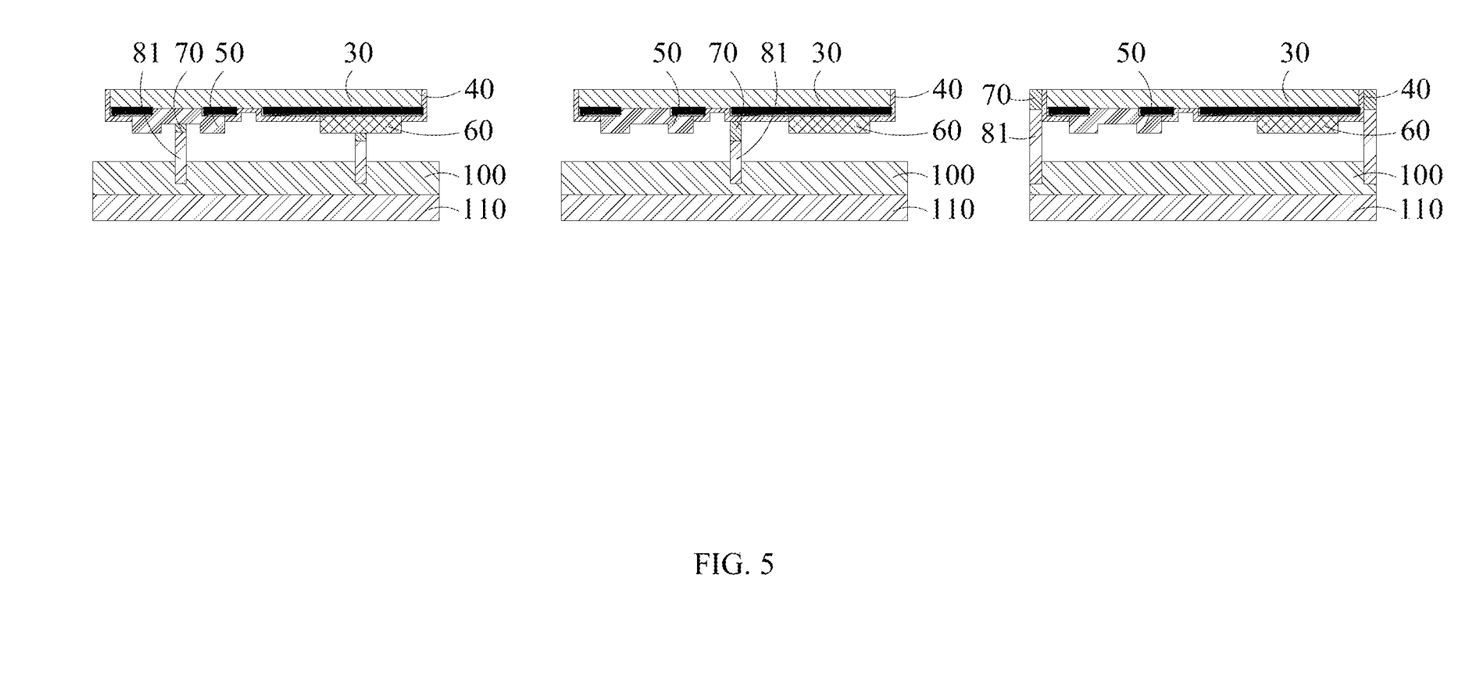
FIG. 5 is a structural diagram of a light-emitting diode with the support structure according to the first, second and third embodiment of the present invention.

Please refer to FIG. 5, which is the structural diagram of a light-emitting diode with the support structure according to the first, second and third embodiment of the present invention. As shown in FIG. 5, the light-emitting diode with the supporting structure includes a carrier substrate 110, an adhesive layer 100, and a sacrifice structure. The adhesive layer 100 is disposed on the carrier substrate 110. The sacrifice structure is disposed on the adhesive layer 100, and includes the supporting posts 81 and the breaking layer 70. The breaking layer 70 is disposed on the supporting posts 81. Based on the manufacturing method of the support structure for light-emitting diode in the first embodiment, the sacrifice structures are disposed between the electrodes of the light-emitting diode and the adhesive layer 100. Namely, the sacrifice structures are respectively located between the first type contact region 50 and the adhesive layer 100 and between the second type contact region 60 and the adhesive layer 100. Based on the manufacturing method of the support structure for light-emitting diode in the second embodiment, the sacrifice structure is disposed between the dielectric region 40 of the light-emitting diode and the adhesive layer 100. Hence, the light-emitting diodes can be separated from the carrier substrate 110 without damaging the electrodes of the light-emitting diodes. Based on the manufacturing method of the support structure for light-emitting diode in the third embodiment, the sacrifice structure is disposed between a perimeter of the light-emitting diode and the adhesive layer 100. No matter where the location of the sacrifice structure is, the structural strength of the sacrifice structure is sufficient to support a light-emitting diode, and when an external force is applied to the light-emitting diode or the carrier substrate 110, the breaking layer 70 is the first layer to be broken, separating the light-emitting diode and the carrier substrate 110 from each other. The support structure for light-emitting diode of the present invention utilizes the breaking layer 70 to separate the light-emitting diode from the carrier substrate 110. The separated light-emitting diode is then transferred to a circuit board of the display.

In an embodiment, in order to more easily separate the light-emitting diode from the carrier substrate 110, the breaking layer 70 can be designed with the structural properties below: a cross-sectional area of the breaking region of the breaking layer 70 is lower than or equal to a cross-sectional area of the sacrifice structure, a supporting force of the breaking layer 70 is lower than a supporting force of the supporting layer 90, an interface bonding force of the breaking layer 70 is lower than that of the supporting layer 90, the hydrophobic surface material can be added to decrease the adhesion between the breaking layer 70 and the light-emitting diode, and the material of the breaking layer 70 can include one of photo-resist, an organic material, and/or a low-melting-point metal material such as indium (In) and tin (Sn). Preferably, the breaking layer 70 is the layer having the minimal supporting force in the support structure for light-emitting diode of the present invention, the breaking layer 70 is the layer having the minimal material intensity in the support structure for light-emitting diode of the present invention, and the breaking layer 70 is the layer having the minimal interface bonding force in the support structure for light-emitting diode of the present invention.

Furthermore, when the glass substrate is used as the carrier substrate, in consideration of the eutectic bonding temperature between the first type contact region 50, each second type contact region 60 of each light-emitting diode and the metal conductive line of the glass substrate should be considered, and a transition temperature of the glass substrate should be considered. In an embodiment, the material of the breaking layer 70 can be gold tin alloy preferably, and can be manufactured by low-temperature CVD, a low-temperature sputtering method, or a low-temperature coating method, so as to facilitate operation of smoothly transferring the light-emitting diode to the circuit board of the display.

Figure 6:
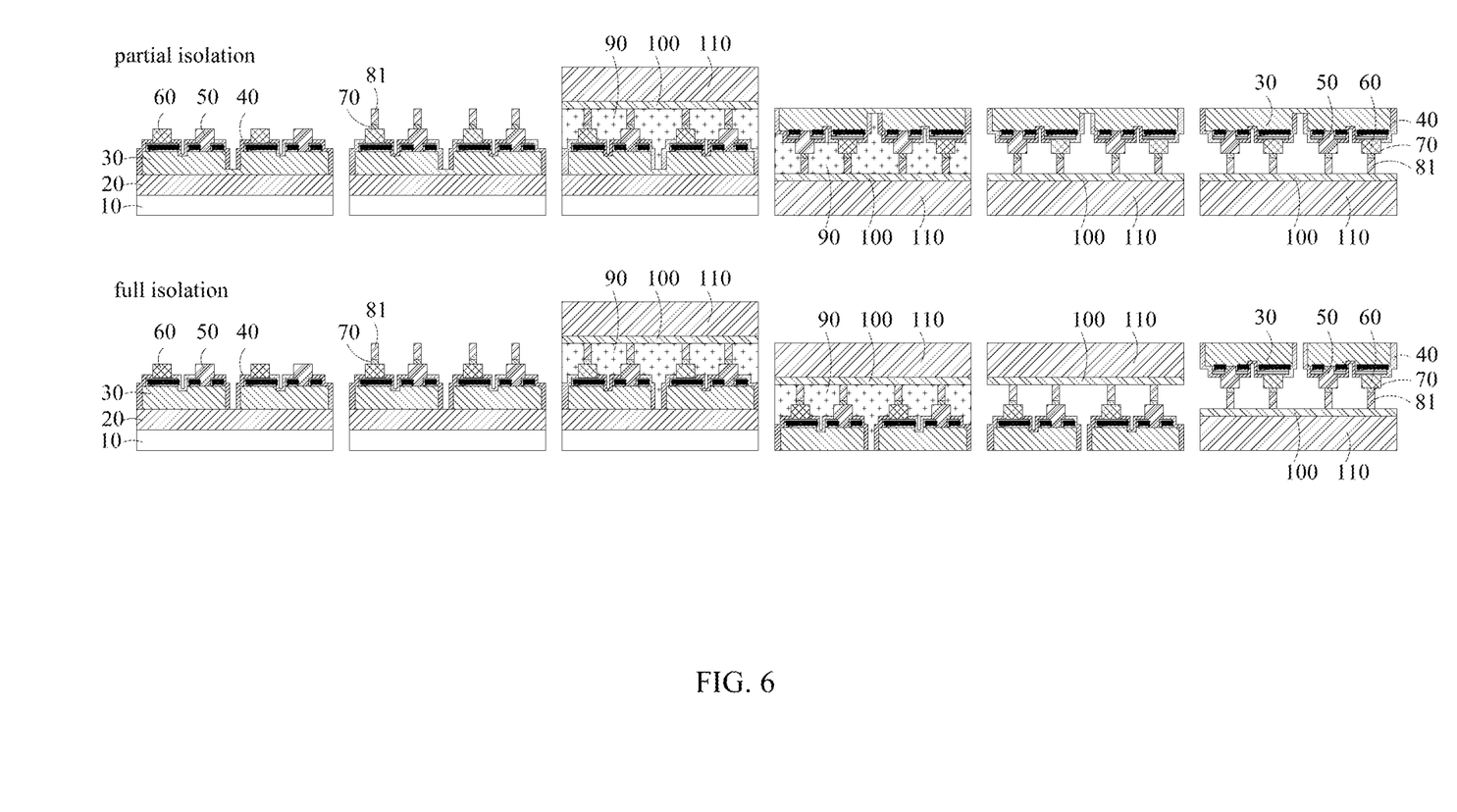
FIG. 6 is a manufacturing method of the support structure for light-emitting diode with partial isolation and full isolation according to the embodiment of the present invention.

Please refer to FIG. 6, which is a manufacturing method of the support structure for light-emitting diode with partial isolation and full isolation according to the embodiment of the present invention. As FIG. 6, illustrated, the manufacturing method of the support structure for light-emitting diode with full isolation and partial isolation is the same as the manufacturing method of the support structure for light-emitting diode in the first embodiment, but adds another light-emitting diode. The full isolation is that the dielectric region 40 forms a trench to electrically isolate two light-emitting diode. The partial isolation is that two light-emitting diodes are connected to each other. No matter the manufacturing method of the support structure for light-emitting diode with full isolation or partial isolation, the light-emitting diode is successfully transferred to the carrier substrate 110.

Figure 7:
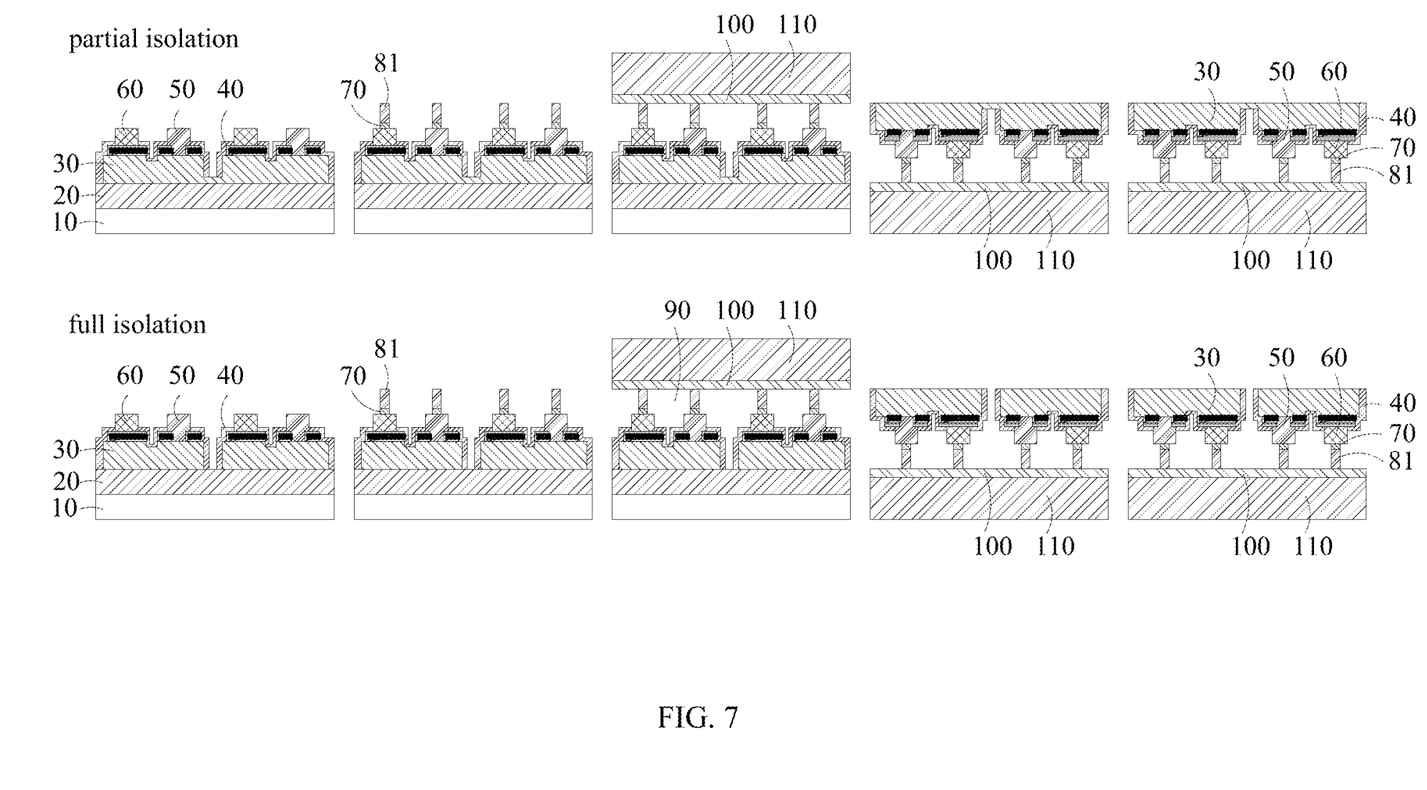
FIG. 7 is a manufacturing method of the support structure for light-emitting diode with partial isolation and full isolation under the condition that there is no coating process according to the embodiment of the present invention.

Please refer to FIG. 7, which is a manufacturing method of the support structure for light-emitting diode with partial isolation and full isolation under the condition that there is no coating process according to the embodiment of the present invention. As FIG. 7 illustrated, the manufacturing method of the support structure for light-emitting diode with partial isolation and full isolation is the same as that in FIG. 6, but there is no coating process. Regardless of the coating process, the light-emitting diode is still transferred to the carrier substrate 110.

According to above-mentioned content, the present invention discloses that the sacrifice structure is disposed on the adhesive layer 110, and the breaking layer 70 of the sacrifice structure is the first layer to be broken while the light-emitting diode is being separated from the carrier substrate 110, so that the light-emitting diodes can be separated from the carrier substrate 110 without damaging the film in the light-emitting diode, the separated light-emitting diode can be smoothly transferred to the circuit board of the display. As described above, the support structure for light-emitting diode of the present invention has aforementioned advantages, so that the light-emitting diode can be smoothly transferred to the circuit board of the display.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A support structure for a light-emitting diode, comprising,
   a carrier substrate;
   an adhesive layer disposed on the carrier substrate; and
   a sacrifice structure disposed on the adhesive layer comprising a supporting post and a breaking layer, and the breaking layer is disposed on the supporting post;
   wherein a structural strength of the sacrifice structure is sufficient to support a light-emitting diode, and when an external force is applied to the light-emitting diode or the carrier substrate, the breaking layer is the first layer to be broken, separating the light-emitting diode and the carrier substrate from each other.

2. The support structure for the light-emitting diode according to claim 1, wherein the sacrifice structure is disposed between an electrodes of the light-emitting diode and the adhesive layer.

3. The support structure for the light-emitting diode according to claim 1, wherein the sacrifice structure is disposed between a dielectric region of the light-emitting diode and the adhesive layer.

4. The support structure for the light-emitting diode according to claim 1, wherein the sacrifice structure is disposed between a perimeter of the light-emitting diode and the adhesive layer.

5. The support structure for the light-emitting diode according to claim 1, wherein a cross-sectional area of the breaking layer is lower than or equal to a cross-sectional area of the supporting post.

6. The support structure for light-emitting diode according to claim 1, wherein a supporting force of the breaking layer is lower than a supporting force of the supporting post.

7. The support structure for light-emitting diode according to claim 1, wherein an interface bonding force of the breaking layer is lower than an interface bonding force of the supporting post.

* * * * *